US006909492B2

(12) United States Patent
Omura

(10) Patent No.: US 6,909,492 B2
(45) Date of Patent: Jun. 21, 2005

(54) PROJECTION OPTICAL SYSTEM, EXPOSURE APPARATUS AND EXPOSURE METHOD

(75) Inventor: Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 35 days.

(21) Appl. No.: 10/412,258

(22) Filed: Apr. 14, 2003

(65) Prior Publication Data

US 2003/0234912 A1 Dec. 25, 2003

(30) Foreign Application Priority Data

Apr. 17, 2002 (JP) ..................... P2002-114208

(51) Int. Cl.⁷ .............. G03B 27/54; G03B 27/42
(52) U.S. Cl. .................. 355/67; 355/53
(58) Field of Search ............. 355/53, 55, 67–71, 355/77; 359/636–640, 726–727, 732

(56) References Cited

U.S. PATENT DOCUMENTS 3,574,459 A    4/1971  Hartwig et al.
4,678,321 A    7/1987  Inokuchi
4,736,225 A    4/1988  Tanaka et al.
5,861,997 A    1/1999  Takahashi
6,512,631 B2   1/2003  Shafer et al.
2003/0011755 A1 1/2003  Omura et al.

*Primary Examiner*—Henry Hung Nguyen
(74) *Attorney, Agent, or Firm*—Oliff & Berridge PLC

(57) ABSTRACT

Disclosed is a projection optical system having relatively large image-side numerical aperture and projection field and being excellent in mechanical stability in respect of vibrations, and the like. The projection optical system includes a first image-forming optical system for forming a first intermediate image of a first surface (R), a second image-forming optical system having a concave reflective mirror and for forming a second intermediate image based on a radiation beam from the first intermediate image, and a third image-forming optical system for forming a final image on a second surface based on a radiation beam from the second intermediate image. Then, predetermined conditional expressions are satisfied with regard to a clear aperture diameter of the concave reflective mirror, a distance (L) between the first surface and the second surface, and a distance (H) between the concave reflective mirror and a reference optical axis.

26 Claims, 9 Drawing Sheets

PROJECTION OPTICAL SYSTEM, EXPOSURE APPARATUS AND EXPOSURE METHOD

BACKGROUND OF THE INVENTION

1. Field of the Invention

The present invention relates to a projection optical system, an exposure apparatus and an exposure method. More particularly, the present invention relates to a high-resolution catadioptric projection optical system suitable for a projection exposure apparatus used when semiconductor devices and liquid crystal display devices are fabricated in a photolithography step.

2. Related Background of the Invention

In a photolithography step for fabricating semiconductor devices or the like, a projection exposure apparatus for exposing a pattern image of a photomask or a reticle (hereinafter, generically referred to as "reticle"), through a projection optical system, on a wafer (or a glass plate) which is coated with photoresist and the like is used. Then, as a scale of integration of the semiconductor devices or the like is improved, resolving power (resolution) required for the projection optical system of the projection exposure apparatus is increased more and more. As a result of this, it is necessary to shorten wavelength of illumination light (exposure light) and to increase a numerical aperture (NA) of the projection optical system in order to satisfy a demand for the resolving power of the projection optical system.

For example, when exposure light having wavelength of 180 nm or less is used, it is possible to achieve a high resolution of 0.1 $\mu$m or less. However, if the wavelength of the illumination light is shortened, the light absorption will become remarkable, and types of glass materials (optical materials) that are durable enough to practical use will be limited. Particularly, when the wavelength of the illumination light becomes 180 nm or less, materials practically usable are limited to fluorite only. Consequently, in a dioptric (refractive) projection optical system, it becomes impossible to correct a chromatic aberration. Here, the dioptric optical system is an optical system including only transmissive optical members such as lens elements without including reflective mirrors (concave reflective mirrors or convex reflective mirrors) which have power.

As described above, the dioptric projection optical system composed of a single glass material has limitations on an allowable chromatic aberration, and it is inevitable to make a band of a laser light source extremely narrow. In this case, an increase in the cost of the laser light source as well as a decrease in the output thereof cannot be avoided. Moreover, in the dioptric optical system, it is necessary to arrange a large number of positive and negative lenses in order to approximate the Petzval Summation, which determines a field curvature, to 0. On the contrary, the concave reflective mirrors correspond to the positive lenses as optical elements converging light, but are different from the positive lenses in that no chromatic aberrations occur therein and the Petzval Summation takes negative values (incidentally, positive lenses take positive values).

In a so-called catadioptric optical system composed by combining the concave reflective mirrors and the lenses, in spite of a simple configuration thereof, a good correction of the chromatic aberrations and good corrections of various aberrations including the filed curvature are enabled by fully utilizing the above-described features of the concave reflective mirrors in an optical design. Accordingly, for example in International Publication WO01/65296, the applicants of the present application have proposed a three-time image-forming catadioptric optical system, which is composed of a refractive (dioptric) first image-forming optical system, a catadioptric second image-forming optical system and a refractive (dioptric) third image-forming optical system, as a high-resolution projection optical system suitable for the projection exposure apparatus.

However, in the conventional projection optical system disclosed in International Publication WO01/65296, a clear aperture diameter of a concave reflective mirror in the catadioptric second image-forming optical system configuring a protruding portion thereof is relatively large, and therefore mechanical stability in respect of vibrations is apt to be damaged. Moreover, a clear aperture diameter of a lens arranged adjacently to the concave reflective mirror is also relatively enlarged, and therefore it is not easy to procure and process a material that has a predetermined properties in the case where the lens is made of fluorite.

Moreover, because a distance (geometric distance) between an object surface and an image surface is relatively large in the conventional projection optical system, the mechanical stability in respect of vibrations is apt to be damaged. Then, because a distance between a reticle and a wafer is relatively enlarged when the projection optical system is mounted on the exposure apparatus, operativity is apt to be damaged, and height limitations of a clean room are apt to be imposed thereon. Furthermore, when the projection optical system is mounted on an exposure apparatus in which exposure light with wavelength of 200 nm or less is used, for example, a relatively long projection optical path will have to be filled with an inert gas, leading to a disadvantage in purging the inert gas.

Furthermore, in the conventional projection optical system, a distance from the concave reflective mirror in the catadioptric second image-forming optical system configuring the protruding portion thereof to a reference optical axis (optical axes of the first and third image-forming optical systems) is relatively large. As a result, the mechanical stability in respect of vibrations is apt to be damaged, and fabrication errors are apt to occur in assembling the second image-forming optical system. Moreover, when the projection optical system is mounted on the exposure apparatus in which the exposure light with the wavelength of 200 nm or less is used, for example, the relatively long projection optical path will have to be filled with an inert gas, leading to a disadvantage in purging the inert gas.

SUMMARY OF THE INVENTION

The present invention was made in consideration of the above-described problems.

It is an object of the present invention to provide a three-time image-forming catadioptric optical system having relatively high image-side numerical aperture and projection field, which is a projection optical system configured such that a clear aperture diameter of a concave reflective mirror is relatively small, mechanical stability in respect of vibrations is good, and it is easy to fabricate a fluorite lens arranged adjacently to the concave reflective mirror.

Moreover, it is another object of the present invention to provide a three-time image-forming catadioptric optical system having relatively high image-side numerical aperture and projection field, which is a projection optical system configured such that a distance between an object surface and an image surface is relatively small, mechanical stability in respect of vibrations is good, operativity is good when being mounted on an exposure apparatus, and an advantage is brought in terms of inert gas purging.

Furthermore, it is still another object of the present invention to provide a three-time image-forming catadioptric optical system, which is a projection optical system having relatively high image-side numerical aperture and projection field and being configured such that a distance from a concave reflective mirror to a reference optical axis is relatively small, mechanical stability in respect of vibrations is good, assembly errors are difficult to occur, and an advantage is brought in terms of inert gas purging.

Moreover, it is yet another object of the present invention to provide an exposure apparatus and an exposure method, which are capable of performing high-resolution and high-precision projection exposure by use of the projection optical system of the present invention, which has the relatively high image-side numerical aperture and projection field and is excellent in mechanical stability in respect of vibrations and the like.

In order to achieve the foregoing objects, a first aspect of the present invention provides a projection optical system for forming an image of a first surface onto a second surface, comprising: a first image-forming optical system for forming a first (primary) intermediate image of the first surface, the first image-forming optical system being arranged in an optical path between the first surface and the second surface; a second image-forming optical system including at least one concave reflective mirror and for forming a second (secondary) intermediate image based on a light bean from the first intermediate image, the second image-forming optical system being arranged in an optical path between the first image-forming optical system and the second surface; and a third image-forming optical system for forming a final (ternary) image onto the second surface based on a light beam from the second intermediate image, the third image-forming optical system being arranged in an optical path between the second image-forming optical system and the second surface, wherein a condition of: $Ec/(Na \times Ic) < 10$ is satisfied where a clear aperture diameter of the concave reflective mirror is Ec, an effective diameter of a projection field on the second surface is Ic, and an image-side numerical aperture of the projection optical system is Na.

According to a preferred configuration of the first aspect of the present invention, a condition of: $L/(Na \times Ic) < 63$ is satisfied where a distance between the first surface and the second surface is L, the effective diameter of the projection field on the second surface is Ic, and the image-side numerical aperture of the projection optical system is Na.

According to a preferred configuration of the first aspect of the present invention, an optical axis of the first image-forming optical system and an optical axis of the third-image-forming optical system are set to virtually coincide with each other, and the projection optical system further comprises: a first deflection (folding) mirror arranged in an optical path between the first image-forming optical system and the second image-forming optical system; and a second deflection (folding) mirror arranged in an optical path between the second image-forming optical system and the third image-forming optical system.

According to a preferred configuration of the first aspect of the present invention, a condition of: $H/(Na \times Ic) < 15.5$ is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

According to a preferred configuration of the first aspect of the present invention, a condition of: $H/(Na \times Ic) < 15.5$ is satisfied where a distance between a center of a reflective surface of the concave reflective mirror and the optical axis of the first image-forming optical system is H, the effective diameter of the projection field on the second surface is Ic, and the Image-side numerical aperture of the projection optical system is Na.

According to a preferred configuration of the first aspect of the present invention, an optical axis of the first image-forming optical system and an optical axis of the third-image-forming optical system are set to virtually coincide with each other, and the projection optical system further comprises: a first deflection mirror arranged in an optical path between the first image-forming optical system and the second image-forming optical system; and a second deflection mirror arranged in an optical path between the second image-forming optical system and the third image-forming optical system.

According to a preferred configuration of the first aspect of the present invention, the projection optical system includes at least six aspheric optical surfaces.

According to a preferred configuration of the first aspect of the present invention, each of the first image-forming optical system, the second image-forming optical system and the third image-forming optical system includes at least one aspheric optical surface.

A second aspect of the present invention provides a projection optical system for forming an image of a first surface onto a second surface, comprising: a first image-forming optical system for forming a first intermediate image of the first surface, the first image-forming optical system being arranged on an optical path between the first surface and the second surface; a second image-forming optical system including at least one concave reflective mirror and for forming a second intermediate image based on a light beam from the first intermediate image, the second image-forming optical system being arranged in an optical path between the first image-forming optical system and the second surface; and a third image-forming optical system for forming a final image onto the second surface based on a light beam from the second intermediate image, the third image-forming optical system being arranged in an optical path between the second image-forming optical system and the second surface, wherein a condition of: $L/(Na \times Ic) < 63$ is satisfied where a distance between the first surface and the second surface is L, an effective diameter of a projection field on the second surface is Ic, and an image-side numerical aperture of the projection optical system is Na.

According to a preferred configuration of the second aspect of the present invention, an optical axis of the first image-forming optical system and an optical axis of the third-image forming optical system are set to virtually coincide with each other, and the projection optical system further comprises: a first deflection mirror arranged in an optical path between the first image-forming optical system and the second image-forming optical system; and a second deflection mirror arranged in an optical path between the second image-forming optical system and the third image-forming optical system.

According to a preferred configuration of the second aspect of the present invention, a condition of: $H/(Na \times Ic) < 15.5$ is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

According to a preferred configuration of the second aspect of the present invention, a condition of: H/(Na×Ic) <15.5 is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

According to a preferred configuration of the second aspect of the present invention, the projection optical system includes at least six aspheric optical surfaces.

According to a preferred configuration of the first aspect of the present invention each of the first image-forming optical system, the second image-forming optical system and the third image-forming optical system includes at least one aspheric optical surface.

A third aspect of the present invention provides a projection optical system for forming an image of a first surface onto a second surface, comprising: a first image-forming optical system for forming a first intermediate image of the first surface, the first image-forming optical system being arranged in an optical path between the first surface and the second surface; a second image-forming optical system including at least one concave reflective mirror and for forming a second intermediate image based on a light beam from the first intermediate image, the second image-forming optical system being arranged in an optical path between the first image-forming optical system and the second surface; a third image-forming optical system for forming a final image onto the second surface based on a light beam from the second intermediate image, the third image-forming optical system being arranged in an optical path between the second image-forming optical system and the second surface; a first deflection mirror arranged in an optical path between the first image-forming optical system and the second image-forming optical system; and a second deflection mirror arranged in an optical path between the second image-forming optical system and the third image-forming optical system, wherein an optical axis of the first image-forming optical system and an optical axis of the third-image forming optical system are set to virtually coincide with each other, and a condition of: H/(Na×Ic)<15.5 is satisfied where a distance between a center of a reflective surface of the concave reflective mirror and the optical axis of the first image-forming optical system is H, a effective diameter of a projection field on the second surface is Ic, and an image-side numerical aperture of the projection optical system is Na.

According to a preferred configuration of the third aspect of the present invention, the projection optical system includes at least six aspheric optical surfaces.

According to a preferred configuration of the third aspect of the present invention, each of the first image-forming optical system, the second image-forming optical system and the third image-forming optical system includes at least one aspheric optical surface.

According to a preferred configuration of the first through third aspect of the present invention, a second surface side numerical aperture of the projection optical system are higher than a first surface side numerical aperture of the projection optical system. In this case the projection optical system preferably forms a reduced image of the first surface onto the second surface.

A fourth aspect of the present invention provides an exposure apparatus, comprising: an illumination system for illuminating a mask that is set on the first surface; and the projection optical system according to the first aspect of the invention for forming a pattern image, which is formed on the mask, onto a photosensitive substrate that is set on the second surface.

According to a preferred configuration of the fourth aspect of the present invention, an effective exposure area on the photosensitive substrate is a rectangular area having a center separate from the optical axis of the third image-forming optical system by a predetermined distance.

A fifth aspect of the present invention provides an exposure method, comprising the steps of: illuminating a mask that is set on the first surface; and projecting and exposing a pattern image, which is formed on the mask, through the projection optical system according to the first aspect of the invention onto a photosensitive substrate which is set on the second surface.

A sixth aspect of the present invention provides an exposure apparatus, comprising: an illumination system for illuminating a mask that is set on the first surface; and the projection optical system according to the second aspect of the invention for forming a pattern image, which is formed on the mask, onto a photosensitive substrate that is set on the second surface.

According to a preferred configuration of the sixth aspect of the present invention, an effective exposure area on the photosensitive substrate is a rectangular area having a center separate from the optical axis of the third image-forming optical system by a predetermined distance.

A seventh aspect of the present invention provides an exposure method, comprising the steps of: illuminating a mask that is set on the first surface; and projecting and exposing a pattern image, which is formed on the mask, through the projection optical system according to the second aspect of the invention onto a photosensitive substrate that is set on the second surface.

An eighth aspect of the invention provides an exposure apparatus, comprising: an illumination system for illuminating a mask that is set on the first surface; and the projection optical system according to the third aspect of the invention for forming a pattern image, which is formed on the mask, onto a photosensitive substrate that is set on the second surface.

According to a preferred configuration of the eighth aspect of the present invention, an effective exposure area on the photosensitive substrate is a rectangular area having a center separate from an optical axis of the third image-forming optical system by a predetermined distance.

A ninth aspect of the present invention provides an exposure method, comprising the steps of: illuminating a mask that is set on the first surface; and projecting and exposing a pattern image, which is formed on the mask, through the projection optical system according to the third aspect of the invention onto a photosensitive substrate that is set on the second surface.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of

DESCRIPTION OF THE PREFERRED EMBODIMENTS

Figure 1:
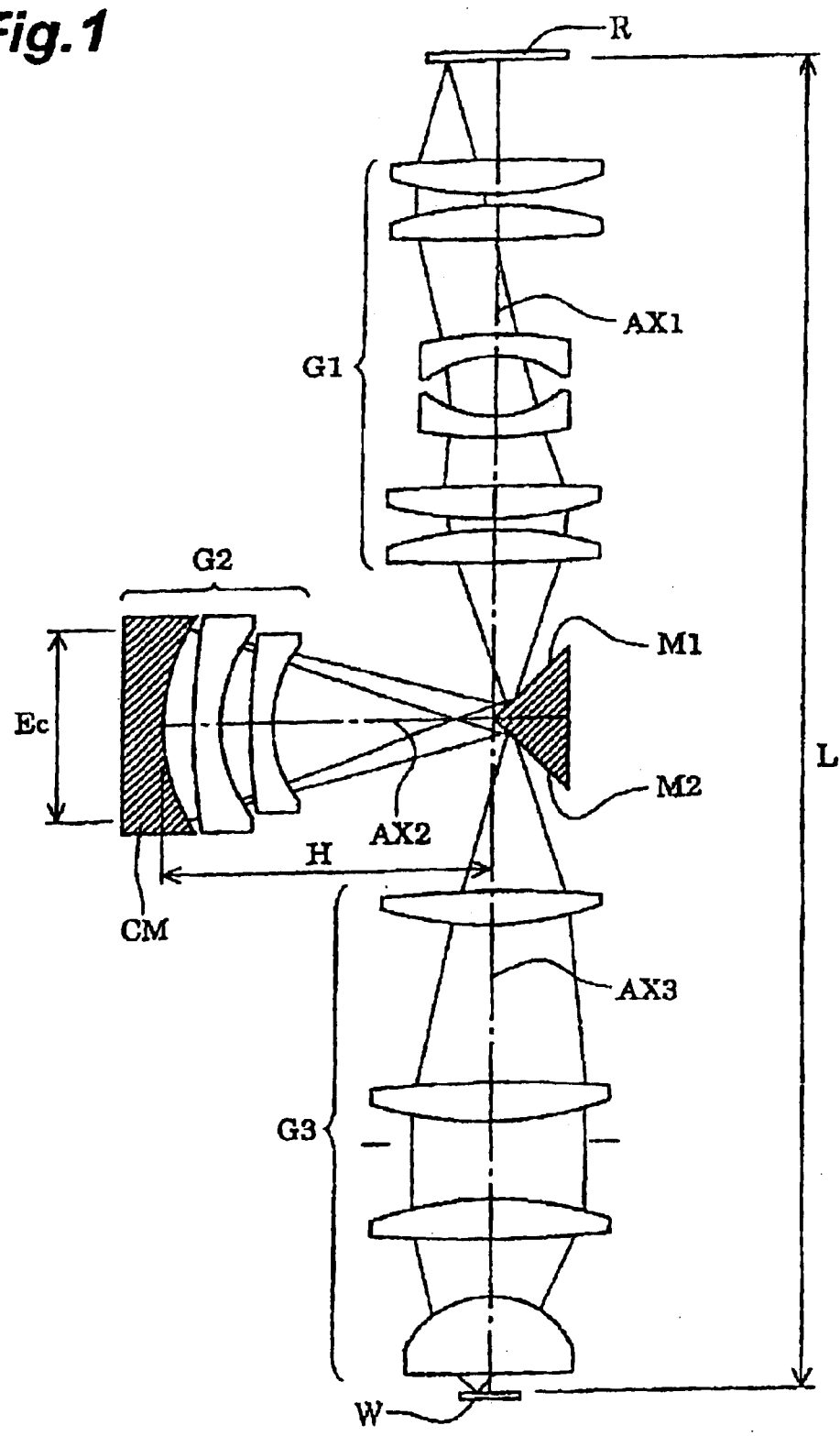
FIG. 1 is a diagram for explaining a basic configuration of a projection optical system according to a typical aspect of the present invention.

FIG. 1 is a diagram for explaining a basic configuration of a projection optical system according to a typical aspect of the present invention. Note that the projection optical system of the present invention is assumed to be applied to an exposure apparatus in FIG. 1. As illustrated in FIG. 1, the projection optical system of the present invention includes the refractive (dioptric) first image-forming optical system G1 for forming a first (primary) intermediate image of a pattern of the reticle R as a projection master placed on the first surface.

The first optical path-bending mirror (first folding mirror) M1 is arranged in the vicinity of the forming position of the first intermediate image that is formed by the first image-forming optical system G1. The first optical path-bending mirror M1 deflects a light beam which travels toward the first intermediate image or a light beam which travels from the first intermediate image, toward the second image-forming optical system G2. The second image-forming optical system G2 has at least one concave reflective mirror CM and forms a second intermediate image (image of the first intermediate image and secondary image of the reticle pattern) in the vicinity of the forming position of the first intermediate image.

The second optical path-bending mirror (second folding mirror) M2 is arranged in the vicinity of the forming position of the second intermediate image formed by the second image-forming optical system G2. The second optical path-bending mirror M2 deflects a light beam which travels toward the second intermediate image or a light beam which travels from the second intermediate image, toward the refractive (dioptric) third image-forming optical system G3. Here, the reflective surface of the first optical path-bending mirror M1 and the reflective surface of the second optical path-bending mirror M2 are positioned so as not to be spatially overlapped each other. The third image-forming optical system G3, based on the light beam from the second intermediate image, forms the pattern image (image of the secondary intermediate image and final image of the projection optical system) of the reticle R onto the wafer W which serves as a photosensitive substrate placed on the second surface.

The configuration of the present invention will be described below in far more detail with reference to each conditional expression. In the first aspect of the present invention, the following conditional expression (1) is satisfied in the above-described basic configuration. Note that, in the conditional expression (1), the reference symbol Ec denotes the clear aperture diameter of the concave reflective mirror CM as illustrated in FIG. 1. Moreover, the reference symbol Ic denotes the effective diameter of the projection field on the wafer W (second surface), and the reference symbol Na denotes the image-side (second face-side) numerical aperture of the projection optical system.

$$Ec/(Na \times Ic) < 10 \tag{1}$$

In the three-time image-forming projection optical system the clear aperture diameter Ec of the concave reflective mirror CM in the second image-forming optical system G2 Which configures the protruding portion of the projection optical system can be controlled to be relatively small by satisfying the conditional expression (1). As a result, it is possible to realize a projection optical system configured such that mechanical stability in respect of vibrations is good and it is easy to fabricate a fluorite lens which is arranged adjacently to the concave reflective mirror CM. Note that the upper limit value of the conditional expression (1) is set at 9.7, and the lower limit value thereof is set at 4, thus making it possible to further enhance the mechanical stability in respect of vibrations and to further facilitate the fabrication of the fluorite lens arranged adjacently to the concave reflective mirror CM.

Moreover, in the second aspect of the present invention, the following conditional expression (2) is satisfied in the above-described basic configuration. Note that, in the conditional expression (2), the reference symbol L denotes the distance (geometric distance) between the pattern surface (first surface: object surface) of the reticle R and the exposure surface (second surface: image surface) of the wafer W as illustrated in FIG. 1. Moreover, as described above, the reference symbol Ic denotes the effective diameter of the projection field, and the reference symbol Na denotes the image-side numerical aperture.

$$L/(Na \times Ic) < 63 \tag{2}$$

In the three-time image-forming projection optical system, the distance L between the object surface and the image surface can be controlled to be relatively small by satisfying the conditional expression (2). As a result, it is possible to realize a projection optical system configured such that mechanical stability in respect of vibrations is good, operativity is good when being mounted on the exposure apparatus, and an advantage is brought in terms of inert gas purging. Note that the upper limit value of the conditional expression (2) is set at 60, and the lower limit value thereof is set at 25, thus making it possible to further enhance the mechanical stability in respect of vibrations, the operativity, and the advantage in terms of the inert gas purging.

Moreover, in the third aspect of the present invention, in the above-described basic configuration, the optical axis AX1 of the first image-forming optical system G1 and the optical axis AX3 of the third image-forming optical system G3 are set so as to virtually coincide with each other, and the following conditional expression (3) is satisfied. Note that, in the conditional expression (3), the reference symbol H denotes the distance between the center of the reflective surface of the concave reflective mirror CM and the optical axis AX1 of the first image-forming optical system G1, as illustrated in FIG. 1. Moreover, as described above, the reference symbol Ic denotes the effective diameter of the projection field, and the reference symbol Na denotes the image-side numerical aperture.

$$H/(Na \times Ic) < 15.5 \tag{3}$$

In the three-time image-forming projection optical system, the distance H from the concave reflective mirror CM in the second image-forming optical system G2 which configures the protruding portion of the projection optical system to the reference optical axis (optical axis AX1 of the first image-forming optical system) can be controlled to be relatively small by satisfying the conditional expression (3). As a result, it is possible to realize a projection optical system configured such that the mechanical stability in respect of vibrations is good, the assembly errors are difficult to occur, and an advantage is brought in terms of inert gas purging when the projection optical system is mounted on the exposure apparatus. Note that the upper limit value of the conditional expression (3) is set at 15.2, and the lower limit value thereof is set at 6.5, thus making it possible to further improve the mechanical stability in respect of vibrations, to have a better control of assembly errors, and to make the projection optical system more advantageous in terms of inert gas purging.

Incidentally, in order to perform the better aberration correction in the present invention, it is preferable for the projection optical system to include at least six aspheric optical surfaces. Moreover, it is preferable for each of the image-forming optical systems configuring the projection optical system to include at least one aspheric optical surface in order to achieve miniaturization of each of the image-forming optical systems.

Furthermore, in the second aspect of the present invention, it is preferable that the optical axis AX1 of the first image-forming optical system G1 and the optical axis AX3 of the third image-forming optical system G3 be set so as to virtually coincide with each other. With such a configuration, it is made possible to arrange all of the lenses configuring the first image-forming optical system G1 and all of the lenses configuring the third image-forming optical system G3 along a virtually single optical axis, and eventually, to make a setting such that the flexure of the lenses due to gravitation is rotationally symmetric. Thus, it is made possible to control a degradation of image-forming performance to be small by an optical adjustment.

The embodiments of the present invention will be described based on the a accompanying drawings.

Figure 2:
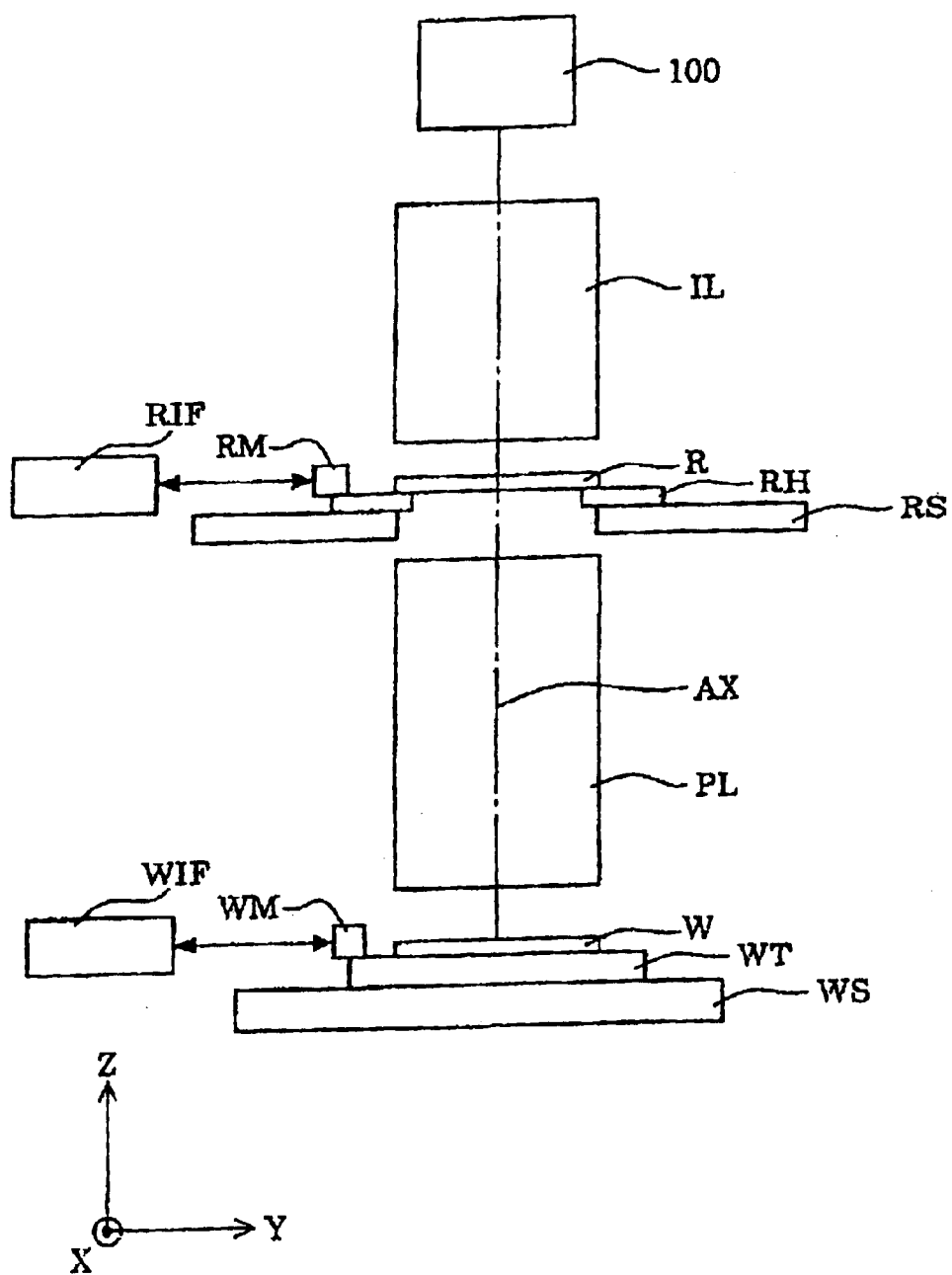
FIG. 2 is diagram schematically illustrating a configuration of an exposure apparatus provided with a projection optical system according to an embodiment of the present invention.

FIG. 2 is a diagram schematically illustrating a constitution of an exposure apparatus having a projection optical system according to the embodiments of the present invention. Note that, in FIG. 2, the Z axis is set in parallel to the reference optical axis AX of the projection optical system PL, the Y axis is set in parallel to the sheet surface of FIG. 2 on a surface vertical to the reference optical axis AX, and the X axis is set vertically to the sheet surface of FIG. 2.

The illustrated exposure apparatus is provided with, for example, a $F_2$ laser light source used (center wavelength of oscillation: 157.6244 nm) as the light source (radiation source) 100 for supplying illumination light (illumination radiation) in the ultraviolet range. Light emitted from the light source 100 evenly illuminates the reticle R on which a predetermined pattern is formed through the illumination optical system IL. Note that an optical path between the light source 100 and the illumination optical system IL is hermetically sealed by a casing (not shown), and a space from the light source 100 to an optical member closest to the reticle in the illumination optical system IL is filled with an inert gas having low absorptivity of exposure light (exposure radiation), such as helium gas and nitrogen, or is maintained in a virtually vacuum state.

The reticle R is held in parallel to the XY plane on the reticle stage RS by the reticle holder RH. The pattern to be transferred is formed on the reticle R, and, among the entire pattern area, a rectangular (slit-shaped) pattern area that has long sides along the X direction and short sides along the Y direction is illuminated. The reticle stage RS is constituted in such a manner that it is two-dimensionally movable along the reticle surface (i.e., XY plane) by an operation of an unillustrated drive system and that position coordinates thereof are measured and controlled in position by the interferometer RIF using the reticle-moving mirror RM.

Light from the pattern formed on the reticle R forms a reticle pattern image on the wafer W, a photosensitive substrate, through the catadioptric projection optical system PL. The wafer W is maintained in parallel to the XY plane on the wafer stage WS by the wafer table (wafer holder) WT. Then, a pattern image is formed on a rectangular exposure area that has long sides along the X direction and short sides along the Y direction so as to optically correspond to the rectangular illuminated area on the reticle R. The wafer stage WS is constituted in such a manner that it is two-dimensionally movable along the wafer surface (i.e., XY plane) by an operation of an unillustrated drive system and that position coordinates thereof are measured and controlled in position by the interferometer WIF using the wafer-moving mirror WM.

Figure 3:
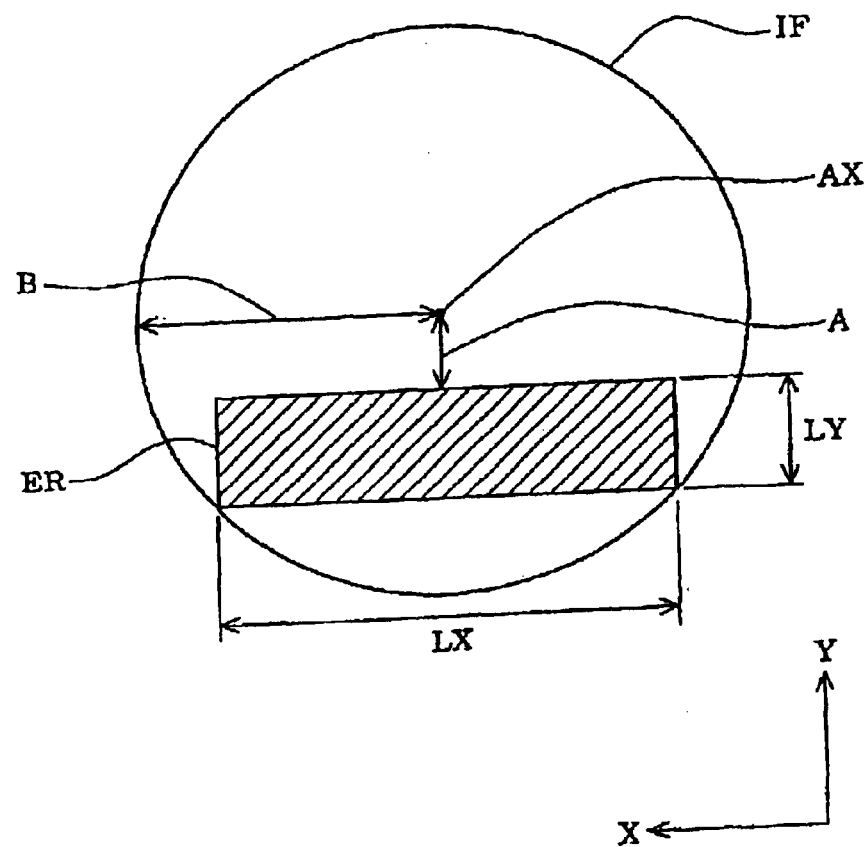
FIG. 3 is a diagram illustrating a positional relationship between a rectangular exposure area (that is, effective exposure area) formed on a wafer and a reference optical axis.

FIG. 3 is a diagram illustrating a positional relationship between the rectangular exposure area (i.e. effective exposure area) formed on the wafer and a reference optical axis. In each of the embodiments, as illustrated in FIG. 3, the rectangular effective exposure area ER having a desired size is set at a position with an interval of the off-axis A (off-axial amount A) in the −Y direction from the reference optical axis AX is set on the circular area (image circle) IF having the radius B with the reference optical axis AX regarded as a center. Here, the length of the effective exposure area ER in the X direction is denoted by LX, and the length thereof in the Y direction is denoted by LY.

In other words, in each of the embodiments, the rectangular effective exposure area ER having a desired size is set at the position with the distance of the off-axis A in the −Y direction from the reference optical axis AX, and the radius B of the circular image circle IF is defined around the reference optical axis AX as a center so as to include the effective exposure area ER. Accordingly, though not being illustrated, to correspond to the effective exposure area ER, a rectangular illumination area having a size and a shape, which correspond to those of the effective exposure area ER, (i.e., effective illumination area) will be formed at the position at the distance of the off-axis A in the −Y direction from the reference optical axis AX.

Moreover, the illustrated exposure apparatus is constituted such that the inside of the projection optical system PL keeps a hermetically sealed state between an optical member arranged closest to the reticle (lens L11 in each of the embodiments) and an optical member arranged closest to the wafer (lens L313 in each of the embodiments) among optical members constituting the projection optical system PL. Then, a gas inside the projection optical system PL is filled with an inert gas such as helium gas and nitrogen, or the inside is virtually maintained in a vacuum state.

Furthermore, in a narrow optical path between the illumination optical system IL and the projection optical system PL, the reticle R, the reticle stage RS and the like are arranged, and the inside of a casing (not shown) that hermetically surrounds the reticle R, the reticle stage RS and the like is filled with the inert gas such as nitrogen and helium gas or is virtually maintained in a vacuum state.

Moreover, in a narrow optical path between the projection optical system PL and the wafer W, the wafer W, the wafer stage WS and the like are arranged, and the inside of a casing (not shown) that hermetically surrounds the wafer W, the wafer stage WS and the like is filled with the inert gas such as nitrogen and helium gas or is virtually maintained in a vacuum state. Thus, an atmosphere, where the exposure light is hardly absorbed, is formed over the entire optical path from the light source 100 to the wafer W.

As described above, the illumination area on the reticle R and the exposure area on the wafer W (i.e., effective exposure area ER), which are defined by the projection optical system PL, are rectangles having short sides along the Y direction. Accordingly, while controlling the positions of the reticle R and wafer W by use of the drive systems and the interferometers (RIF, WIF), the reticle stage RS and the wafer stage WS are moved along the direction of the short sides of the rectangular exposure and illumination areas, that is, the Y direction. Eventually, the reticle R and the wafer W are synchronously moved (scanned) in the same direction (i.e., the same orientation). Thus, on the wafer W, a reticle pattern is scanned and exposed for an area that has a width equal to that of the long sides of the exposure area and a length that corresponds to a scanned amount (moved amount) of the wafer W.

In each of the embodiments, the projection optical system PL includes the first image-forming optical system G1 that is refractive (dioptric) and for forming the first intermediate image of the pattern of the reticle R arranged on the first surface, the second image-forming optical system G2 that is composed of the concave reflective mirror CM and two negative lenses and for forming the second intermediate image virtually equal to the first intermediate image in size (virtually equal to the first intermediate image in size, which is the secondary image of the reticle pattern), and the third image-forming optical system G3 that is refractive (dioptric) and for forming the final image of the reticle pattern (demagnified (reduced) image of the reticle pattern) on the wafer W arranged on the second surface based on the light from the second intermediate image.

Note that, in each of the embodiments, the first optical path-bending mirror M1 for deflecting the light from the first image-forming optical system G1 toward the second image-forming optical system G2 is arranged in the vicinity of the forming position of the first intermediate image in the optical path between the first image-forming optical system G1 and the second image-forming optical system G2. Moreover, the second optical path-bending mirror M2 for deflecting the light from the second image-forming optical system G2 toward the third image-forming optical system G3 is arranged in the vicinity of the forming position of the second intermediate image in the optical path between the second image-forming optical system G2 and the third image-forming optical system G3.

Moreover, in each of the embodiments, the first image-forming optical system G1 has the optical axis AX1 extended linearly, the third image-forming optical system G3 has the optical axis AX3 extended linearly, and the optical axes AX1 and AX3 are set to coincide with the reference optical axis AX that is a single optical axis shared by the optical axes AX1 and AX3. Note that the reference optical axis AX is positioned along the gravity direction (i.e., vertical direction). Consequently, the reticle R and the wafer W are arranged in parallel to each other along surfaces orthogonal to the gravity direction, that is, the horizontal planes. In addition, all of the lenses constituting the first image-forming optical system G1 and all of the lenses constituting the third image-forming optical system G3 are also arranged along the horizontal planes on the reference optical axis AX.

Meanwhile, the second image-forming optical system G2 has the optical axis AX2 extended linearly, and the optical axis AX2 is set to be orthogonal to the reference optical axis AX. Furthermore, both of the first and second optical path-bending mirrors M1 and M2 have flat reflective surfaces, and are unified and composed as one optical member (one optical path-bending mirror) having two reflective surfaces. An intersecting lines of these two reflective surfaces (precisely, intersecting lines of virtual extended surfaces thereof) is set to intersect with the AX1 of the first image-forming optical system G1, the AX2 of the second image-forming optical system G2 and the AX3 of the third image-forming optical system G3 at one point. In each of the embodiments, both of the first and second optical path-bending mirrors M1 and W are composed as surface reflective mirrors.

In each of the embodiments, fluorite (crystals of $CaF_2$) is used for all of the refractive optical members (lens elements) constituting the projection optical system PL Moreover, the center wavelength of oscillation of $F_2$ laser light, which is exposure light, is 157.6244 nm, and the refractive index of $CaF_2$ in the vicinity of the wavelength of 157.6244 nm is changed with a ratio of $-2.6 \times 10^{-6}$ per wavelength change of +1 pm, and is changed with a ratio of $+2.6 \times 10^{-6}$ per wavelength change of −1 pm. In other words, in the vicinity of the wavelength of 157.6244 nm, dispersion of the refractive index of $CaF_2$ $(dn/d\lambda)$ is $2.6 \times 10^{-6}$/pm.

Accordingly, in each of the embodiments, the refractive index of $CaF_2$ with respect to the center wavelength of 157.6244 nm is 1.55930666, the refractive index of $CaF_2$ with respect to the wavelength of 157.6254 nm (=157.6244 nm+1 pm) is 1.55930406, and the refractive index of $CaF_2$ with respect to the wavelength of 157.6234 nm (=157.6244 nm−1 pm) is 1.55930926.

Moreover, in each of the embodiments, an aspheric surface is represented by the following equation (a) where a height in the vertical direction of the optical axis is y, a distance (sag amount) along the optical axis from a tangential plane at the vertex of the aspheric surface to a position on the aspheric surface at the height y is z, a curvature radius of the vertex is r, a conic coefficient is κ, and an n-ary aspheric coefficient is Cn. In each of the embodiments, reference symbols * are added to the right sides of surface numbers on lens surfaces formed to be aspheric.

[Equation 1] (a)

$$z = (y^2/r)/\left[1 + \{1 - (1+\kappa)\cdot y^2/r^2\}^{1/2}\right] + C_4 \cdot y^4 + C_6 \cdot y^6 + C_8 \cdot y^8 + C_{10} \cdot y^{10} + C_{12} \cdot y^{12} + C_{14} \cdot y^{14}$$

[First Embodiment]

Figure 4:
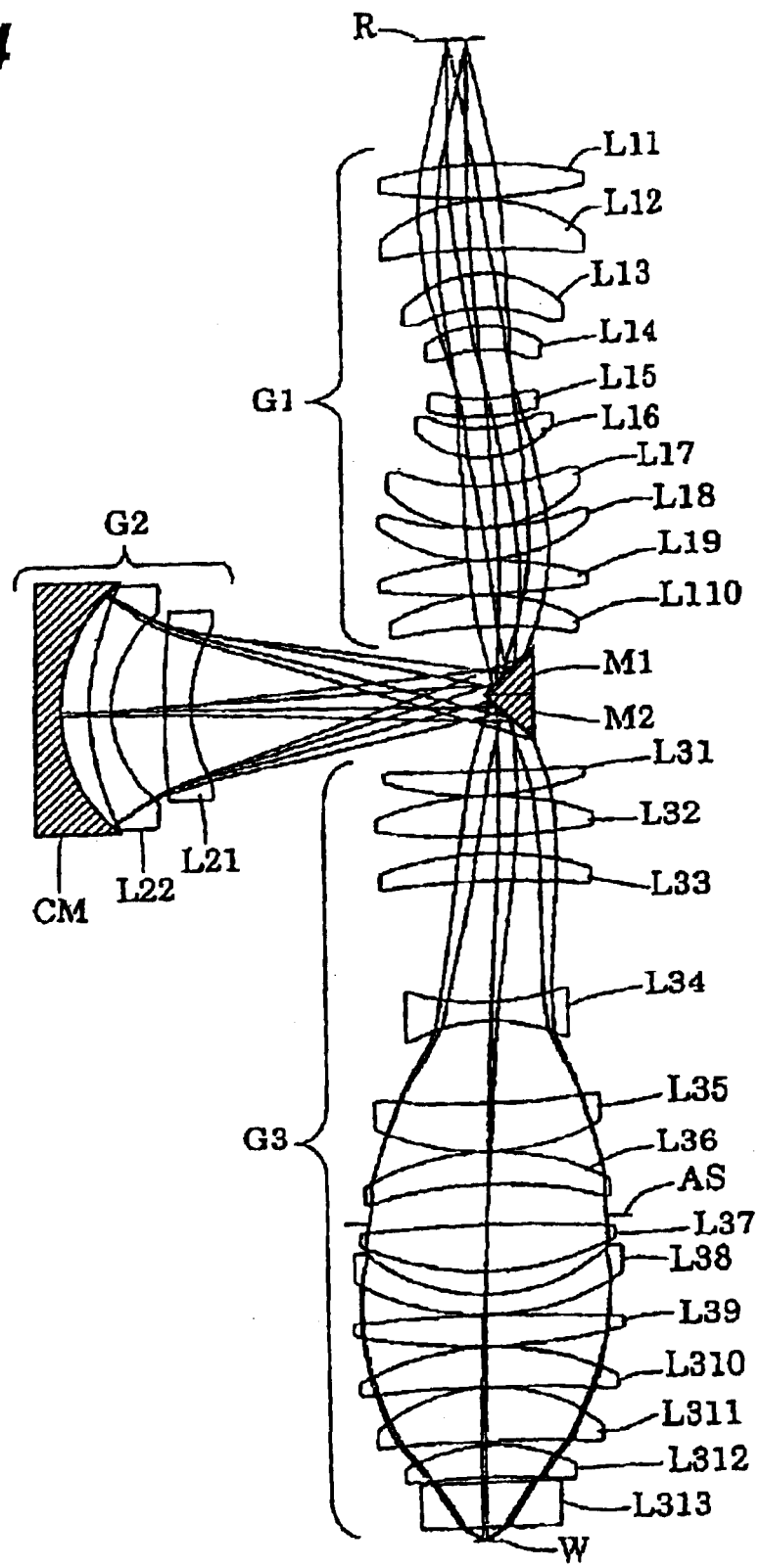
FIG. 4 is a diagram illustrating a configuration of lenses of a projection optical system according to a first embodiment of the present invention.

FIG. 4 is a diagram illustrating a constitution of lenses of a projection optical system according to a first embodiment of the present embodiments. Referring to FIG. 4, in the projection optical system PL according to the first embodiment, the first image-forming optical system is composed of, in order from the reticle side, the biconvex lens L11, the positive meniscus lens L12 orienting its aspheric concave surface to the wafer side, the positive meniscus lens L13 orienting its convex surface to the reticle side, the positive meniscus lens L14 orienting its convex surface to the reticle side, the negative meniscus lens L15 orienting its concave surface to the reticle side, the positive meniscus lens L16 orienting its concave surface to the reticle side, the positive meniscus lens L17 orienting its aspheric concave surface to the reticle side, the positive meniscus lens L18 orienting its concave surface to the reticle side, the biconvex lens L19, and the positive meniscus lens 110 orienting its aspheric concave surface to the wafer side.

Moreover, the second image-forming optical system G2 is composed of the negative meniscus lens L21 orienting its aspheric convex surface to the reticle side, the negative meniscus lens L22 orienting its concave surface to the reticle side, and the concave reflective mirror CM in order from the reticle side along the light traveling path (i.e., incident side).

Furthermore, the third image-forming optical system G3 is composed of, in order from the reticle side along the light traveling direction, the positive meniscus lens L31 orienting its concave surface to the reticle side, the biconvex lens L32, the positive meniscus lens L33 orienting its aspheric concave surface to the wafer side, the biconcave lens L34, the positive meniscus lens L35 orienting its aspheric concave surface to the reticle side, the positive meniscus lens L36 orienting its aspheric concave surface to the wafer side, the aperture stop AS, the biconvex lens L37, the negative meniscus lens L38 orienting its concave surface to the reticle side, the biconvex lens L39, the positive meniscus lens L310 orienting its convex surface to the reticle side, the positive meniscus lens L311 orienting its aspheric concave surface to the wafer side, the positive meniscus lens L312 orienting its convex surface to the reticle side, and the piano-convex lens L313 orienting its plane to the wafer side.

In the following Table (1), specification values of the projection optical system PL according to the first embodiment will be listed. In Table (1), the reference symbol λ denotes a center wavelength of exposure light, the reference symbol β denotes a projection magnification (lateral magnification of the entire system), the reference symbol NA denotes a numerical aperture on the image side (wafer side), the reference symbol B denotes a radius of the image circle IF on the wafer W, the reference symbol A denotes an off-axis of the effective exposure area ER, the reference symbol LX denotes a dimension along the X direction of the effective exposure area ER (dimension of the long sides), and the reference symbol LY denotes a dimension along the Y direction of the effective exposure area ER (dimension of the short sides), respectively.

Moreover, the surface number represents the surfaces in order from the reticle side along the traveling direction of a light beam from the reticle surface, which is the object surface (first surface) to the wafer surface, which is the image surface (second surface). The reference symbol r represents the curvature radii of the respective surfaces (vertex curvature radius in the case of an aspheric surface: inn). The reference symbol d represents the on-axis intervals between the respective surfaces, that is, the surface intervals (mm) The reference symbol ED represents the clear aperture diameters of the respective surfaces (mm) The reference symbol n denotes the refractive indices with respect to the center wavelength.

Note that, with regard to the surface intervals d, signs thereof are defined to be changed each time when light is reflected thereon. Accordingly, the signs of the surface intervals d are set negative in the optical paths from the reflective surface of the first optical path-bending mirror M1 to the concave reflective mirror CM and in the optical path from the reflective surface of the second optical path-bending mirror M2 to the image surface, and the signs are set positive in the other optical paths. Then, in the first image-forming optical system G1, curvature radii of convex surfaces toward the reticle side are set positive, and curvature radii of concave surfaces are set negative. Meanwhile, in the third image-forming optical system G3, curvature radii of convex surfaces toward the reticle side are set positive, and curvature radii of convex surfaces are set negative. Furthermore, in the second image-forming optical system G2, curvature radii of concave surfaces toward the reticle side (that is, incident side) along the light traveling path are set positive, and curvature radii of convex surfaces are set negative. Note that Table (1) and Table (2) described later, share the same notation.

TABLE 1

(Principal Specifications)
λ = 157.6244 nm
β = −0.25
NA = 0.85
B = 14.4 mm
A = 3 mm
LX = 25 mm
LY = 4 mm
(Specifications of Optical Members)

| Surface number | r | d | ED | n | |
|---|---|---|---|---|---|
| | (Reticle surface) | 103.3533 | | | |
| 1 | 374.9539 | 27.7555 | 163.8 | 1.559307 | (L11) |
| 2 | −511.3218 | 2.0000 | 165.0 | | |
| 3 | 129.8511 | 41.0924 | 164.3 | 1.559307 | (L12) |
| 4* | 611.8828 | 20.1917 | 154.3 | | |
| 5 | 93.6033 | 29.7405 | 128.2 | 1.559307 | (L13) |
| 6 | 121.8341 | 16.0140 | 110.0 | | |
| 7 | 83.6739 | 21.7064 | 92.3 | 1.559307 | (L14) |
| 8 | 86.7924 | 42.9146 | 73.8 | | |
| 9 | −112.0225 | 15.4381 | 71.1 | 1.559307 | (L15) |
| 10 | −183.1783 | 9.7278 | 86.8 | | |
| 11 | −103.9725 | 24.6160 | 92.2 | 1.559307 | (L16) |
| 12 | −79.4102 | 26.3046 | 108.7 | | |
| 13* | −166.4447 | 35.1025 | 137.8 | 1.559307 | (L17) |
| 14 | −112.7568 | 1.0007 | 154.4 | | |
| 15 | −230.1701 | 28.4723 | 161.5 | 1.559307 | (L18) |
| 16 | −132.8952 | 1.0000 | 168.4 | | |
| 17 | 268.5193 | 29.4927 | 167.1 | 1.559307 | (L19) |
| 18 | −678.1883 | 1.0000 | 164.3 | | |
| 19 | 155.2435 | 26.5993 | 150.3 | 1.559307 | (L110) |
| 20* | 454.2151 | 61.5885 | 139.9 | | |
| 21 | ∞ | −238.9300 | | | (M1) |
| 22* | 140.0521 | −22.7399 | 124.5 | 1.559307 | (L21) |

TABLE 1-continued

| | | | | |
|---|---|---|---|---|
| 23 | 760.9298 | −44.1777 | 146.1 | |
| 24 | 109.3587 | −16.0831 | 159.6 | 1.559307 (L22) |
| 25 | 269.5002 | −22.7995 | 207.8 | |
| 26 | 159.8269 | 22.7995 | 213.7 | (CM) |
| 27 | 269.5002 | 16.0831 | 209.4 | 1.559307 (L22) |
| 28 | 109.3587 | 44.1777 | 168.2 | |
| 29 | 760.9298 | 22.7399 | 162.0 | 1.559307 (L21) |
| 30* | 140.0521 | 238.9300 | 143.2 | |
| 31 | ∞ | −67.1481 | | (M2) |
| 32 | 2064.4076 | −20.4539 | 154.9 | 1.559307 (L31) |
| 33 | 264.1465 | −1.1114 | 160.0 | |
| 34 | −236.9696 | −36.6315 | 174.4 | 1.559307 (L32) |
| 35 | 548.0272 | −14.7708 | 174.4 | |
| 36 | −261.5738 | −23.7365 | 167.9 | 1.559307 (L33) |
| 37* | −844.5946 | −108.7700 | 162.5 | |
| 38 | 192.9421 | −16.1495 | 127.7 | 1.559307 (L34) |
| 39 | −139.0423 | −71.8678 | 128.7 | |
| 40* | 1250.0000 | −43.1622 | 165.7 | 1.559307 (L35) |
| 41 | 185.8787 | −1.0000 | 180.1 | |
| 42 | −206.0962 | −27.6761 | 195.0 | 1.559307 (L36) |
| 43* | −429.3688 | −30.3562 | 191.8 | |
| 44 | ∞ | −4.0000 | 196.8 | (AS) |
| 45 | −1246.9477 | −40.5346 | 199.6 | 1.559307 (L37) |
| 46 | 229.5046 | −19.2328 | 202.5 | |
| 47 | 153.1781 | −18.0000 | 201.4 | 1.559307 (L38) |
| 48 | 200.0000 | −1.0000 | 213.1 | |
| 49 | −1605.7826 | −25.8430 | 215.0 | 1.559307 (L39) |
| 50 | 497.7325 | −1.0000 | 214.9 | |
| 51 | −232.1186 | −31.8757 | 204.9 | 1.559307 (L310) |
| 52 | −993.7015 | −1.0000 | 198.1 | |
| 53 | −142.9632 | −44.5398 | 178.7 | 1.559307 (L311) |
| 54* | −3039.5137 | −3.0947 | 162.7 | |
| 55 | −139.2455 | −27.2564 | 134.5 | 1.559307 (L312) |
| 56 | −553.1425 | −4.2798 | 116.2 | |
| 57 | −1957.7823 | −37.0461 | 110.3 | 1.559307 (L313) |
| 58 | ∞ | −11.0000 | 63.6 | |

Figure 5:
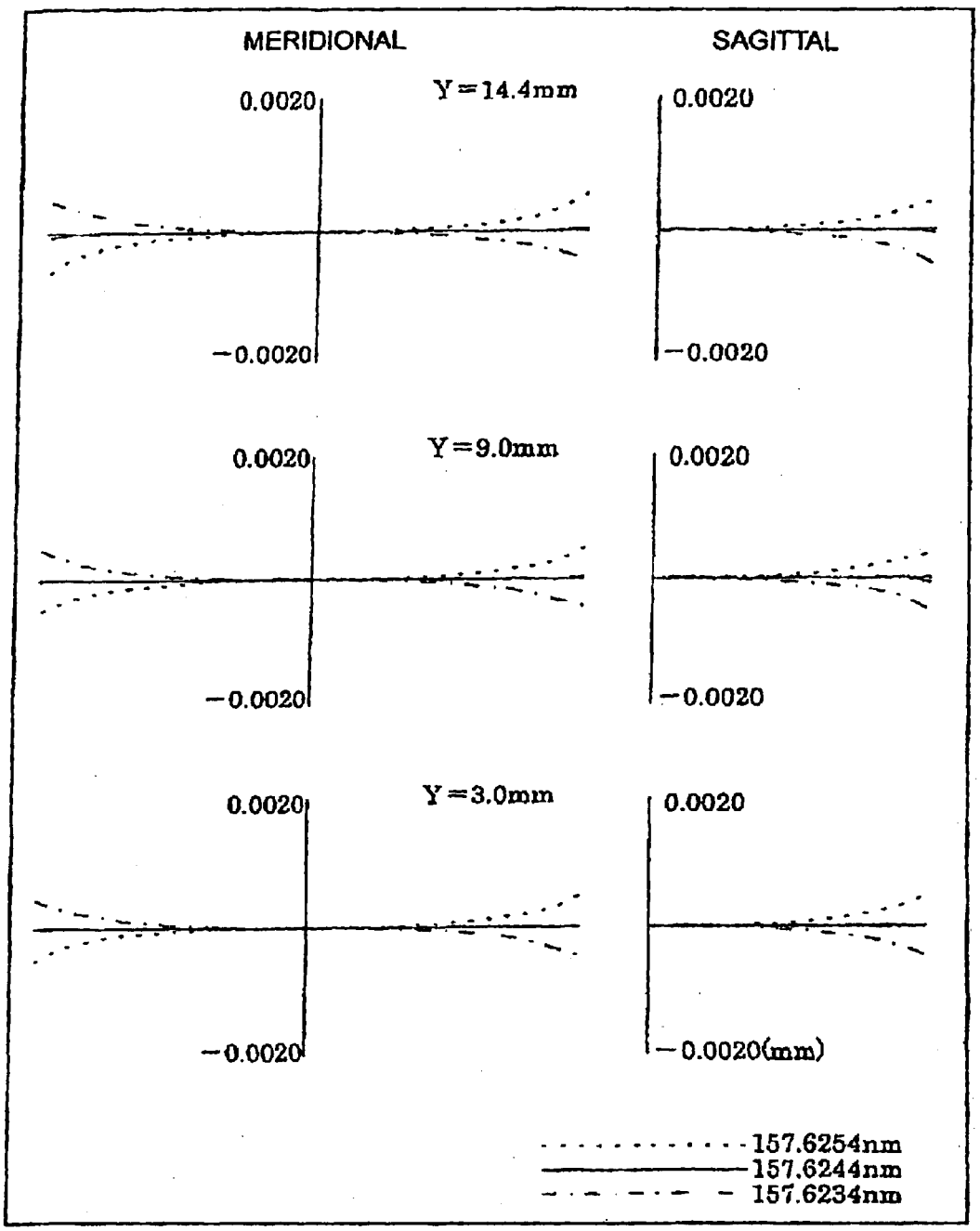
FIG. 5 is diagrams showing transverse aberrations in the first embodiment.

(Wafer surface)
(Aspheric surface data)
4th surface
$\kappa = 0$
$C_4 = 4.21666 \times 10^{-8}$      $C_6 = -1.01888 \times 10^{-12}$
$C_8 = 5.29072 \times 10^{-17}$     $C_{10} = -3.39570 \times 10^{-21}$
$C_{12} = 1.32134 \times 10^{-26}$  $C_{14} = 7.93780 \times 10^{-30}$
13th surface
$\kappa = 0$
$C_4 = 4.18420 \times 10^{-8}$      $C_6 = -4.00795 \times 10^{-12}$
$C_8 = -2.47055 \times 10^{-16}$    $C_{10} = 4.90976 \times 10^{-20}$
$C_{12} = -3.51046 \times 10^{-24}$ $C_{14} = 1.02968 \times 10^{-28}$
20th surface
$\kappa = 0$
$C_4 = 6.37212 \times 10^{-8}$      $C_6 = -1.22343 \times 10^{-12}$
$C_8 = 3.90077 \times 10^{-17}$     $C_{10} = 2.04618 \times 10^{-21}$
$C_{12} = -5.11335 \times 10^{-25}$ $C_{14} = 3.76884 \times 10^{-29}$
22nd surface and 30th surface (identical surfaces)
$\kappa = 0$
$C_4 = -6.69423 \times 10^{-8}$     $C_6 = -1.77134 \times 10^{-14}$
$C_8 = 2.85906 \times 10^{-17}$     $C_{10} = 8.86068 \times 10^{-21}$
$C_{12} = 1.42191 \times 10^{-26}$  $C_{14} = 6.35242 \times 10^{-29}$
37th surface
$\kappa = 0$
$C_4 = -2.34854 \times 10^{-8}$     $C_6 = -3.60542 \times 10^{-13}$
$C_8 = -1.45752 \times 10^{-17}$    $C_{10} = -1.33699 \times 10^{-21}$
$C_{12} = 1.94350 \times 10^{-26}$  $C_{14} = -1.21690 \times 10^{-29}$
40th surface
$\kappa = 0$
$C_4 = 5.39302 \times 10^{-8}$      $C_6 = -7.58468 \times 10^{-13}$
$C_8 = -1.47196 \times 10^{-17}$    $C_{10} = -1.32017 \times 10^{-21}$
$C_{12} = 0$                        $C_{14} = 0$
43rd surface
$\kappa = 0$
$C_4 = -2.36659 \times 10^{-8}$     $C_6 = -4.34705 \times 10^{-13}$
$C_8 = 2.16318 \times 10^{-18}$     $C_{10} = 9.11326 \times 10^{-22}$
$C_{12} = -1.95020 \times 10^{-26}$ $C_{14} = 0$
54th surface
$\kappa = 0$ TABLE 1-continued $C_4 = -3.78066 \times 10^{-8}$     $C_6 = -3.03038 \times 10^{-13}$
$C_8 = 3.38936 \times 10^{-17}$     $C_{10} = -6.41494 \times 10^{-21}$
$C_{12} = 4.14101 \times 10^{-25}$  $C_{14} = -1.40129 \times 10^{-29}$ FIG. 5 are diagrams illustrating transverse aberrations in the first embodiment. In the aberration diagrams, the reference symbol Y represents image heights, the solid lines represent the center wavelength of 157.6244 n the broken lines represent the wavelength of 157.6254 (=157.6244 nm+1 pm), and the alternate long and short dash lines represent the wavelength of 157.6234 (=157.6244 nm−1 pm). Note that FIG. 5 and FIG. 7, which is described later, share the same notation. As clearly shown from the aberration diagrams in FIG. 5, in the first embodiment, chromatic aberrations suitably are corrected for the exposure light with the wavelength width of 157.6244 nm ±1 pm though relatively large image-side numerical aperture (NA=0.85) and projection field (clear aperture diameter=28.8 mm) are secured.

[Second Embodiment]

Figure 6:
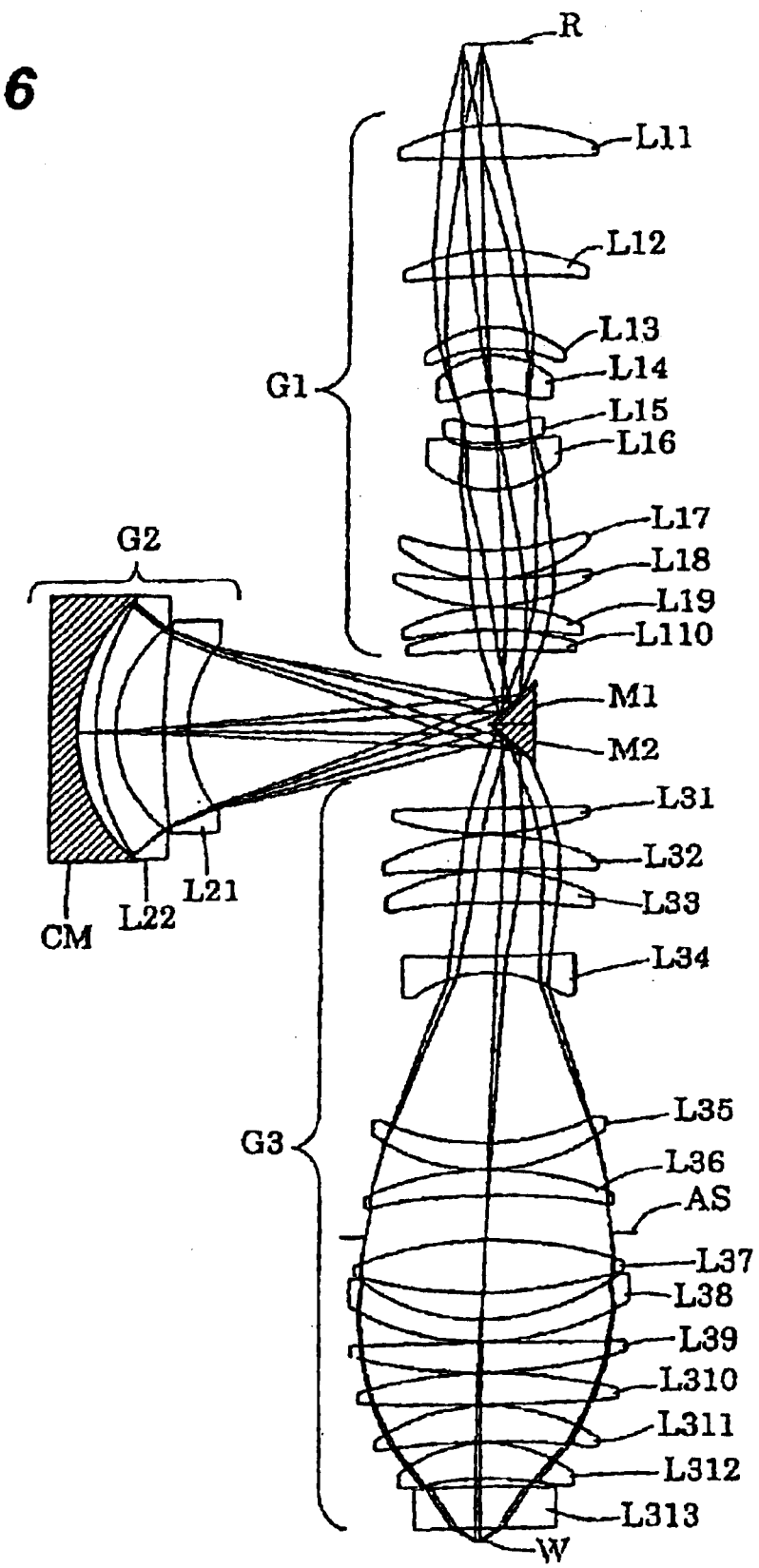
FIG. 6 is a diagram illustrating a configuration of lenses of a projection optical system according to a second embodiment of the present invention.

FIG. 6 is a diagram illustrating a configuration of lenses of a projection optical system according to a second embodiment of the present embodiments. Referring to FIG. 6, in the projection optical system PL according to the second embodiment, the first image-forming optical system G1 is composed of, in order from the reticle side, the biconvex lens L11, the positive meniscus lens L12 orienting its aspheric concave surface to the wafer side, the positive meniscus lens L13 orienting its convex surface to the reticle side, the positive meniscus lens L14 orienting its convex surface to the reticle side, the negative meniscus lens L15 orienting its concave surface to the reticle side, the positive meniscus lens L16 orienting its concave surface to the reticle side, the positive meniscus lens L17 orienting its aspheric concave surface to the reticle side, the positive meniscus lens L18 orienting its concave surface to the reticle side, the positive meniscus lens L19 orienting its convex surface to the reticle side, and the positive meniscus lens L110 orienting its aspheric concave surface to the wafer side.

Moreover, the second image-forming optical system G2 is composed of, in order from the reticle side (that is, incident side) along the light traveling path, the negative meniscus lens L21 orienting its aspheric convex surface to the wafer side (that is, exit side), the negative meniscus lens L22 orienting its concave surface to the reticle side, and the concave reflective mirror CM.

Furthermore, the third image-forming optical system G3 is composed of, in order from the reticle side along the light traveling direction, the positive meniscus lens L31 orienting its concave surface to the reticle side, the positive meniscus lens L32 orienting its convex surface to the reticle side, the positive meniscus lens L33 orienting its aspheric concave surface to the wafer side, the biconcave lens L34, the positive meniscus lens L35 orienting its aspheric concave surface to the reticle side, the positive meniscus lens L36 orienting its aspheric concave surface to the wafer side, the aperture stop AS, the biconvex lens L37, the negative meniscus lens L38 orienting its concave surface to the reticle side, the plano-convex lens L39 orienting its plane to the reticle side, the biconvex lens L310, the positive meniscus lens L311 orienting its aspheric concave surface to the wafer side, the positive meniscus lens L312 orienting its convex surface to the reticle side, and the plano-convex lens L313 orienting its plane to the wafer side.

In the following Table (2), specification values of the projection optical system PL according to the second embodiment will be listed.

TABLE 2

(Principal Specifications)
$\lambda$ = 157.6244 nm
$\beta$ = −0.25
NA = 0.85
B = 14.4 mm
A = 3 mm
LX = 25 mm
LY = 4 mm
(Specifications of Optical Members)

| Surface number | r | d | ED | n | |
|---|---|---|---|---|---|
| | (Reticle surface) | 64.8428 | | | |
| 1 | 183.9939 | 26.4947 | 150.2 | 1.559307 | (L11) |
| 2 | −3090.3604 | 74.3108 | 149.6 | | |
| 3 | 168.6161 | 21.2848 | 138.4 | 1.559307 | (L12) |
| 4* | 630.6761 | 41.2206 | 134.6 | | |
| 5 | 78.6721 | 17.8201 | 104.9 | 1.559307 | (L13) |
| 6 | 104.6154 | 6.3217 | 96.2 | | |
| 7 | 61.9289 | 28.1473 | 86.0 | 1.559307 | (L14) |
| 8 | 71.5027 | 31.3308 | 64.2 | | |
| 9 | −62.9418 | 14.1300 | 60.6 | 1.559307 | (L15) |
| 10 | −108.5396 | 4.2959 | 74.5 | | |
| 11 | −87.0095 | 32.7581 | 76.6 | 1.559307 | (L16) |
| 12 | −74.4464 | 51.3253 | 99.3 | | |
| 13* | −187.4766 | 24.0651 | 136.3 | 1.559307 | (L17) |
| 14 | −108.3982 | 1.0000 | 142.6 | | |
| 15 | −377.3605 | 23.5413 | 145.7 | 1.559307 | (L18) |
| 16 | −140.1956 | 1.0164 | 148.0 | | |
| 17 | 160.9494 | 18.0355 | 135.5 | 1.559307 | (L19) |
| 18 | 331.3044 | 1.0260 | 130.4 | | |
| 19 | 201.2009 | 17.3139 | 127.3 | 1.559307 | (L110) |
| 20* | 1155.1346 | 61.5885 | 121.3 | | |
| 21 | ∞ | −240.7562 | | | (M1) |
| 22 | 116.6324 | −19.2385 | 137.5 | 1.559307 | (L21) |
| 23* | 765.4623 | −38.0668 | 169.7 | | |
| 24 | 116.0112 | −16.0000 | 174.7 | 1.559307 | (L22) |
| 25 | 208.8611 | −16.2875 | 217.3 | | |
| 26 | 159.0966 | 16.2875 | 221.6 | | (CM) |
| 27 | 208.8611 | 16.0000 | 218.2 | 1.559307 | (L22) |
| 28 | 116.0112 | 38.0668 | 178.5 | | |
| 29* | 765.4623 | 19.2385 | 176.3 | 1.559307 | (L21) |
| 30 | 116.6324 | 240.7562 | 146.6 | | |
| 31 | ∞ | −73.9823 | | | (M2) |
| 32 | 15952.4351 | −21.9279 | 141.9 | 1.559307 | (L31) |
| 33 | 221.6147 | −1.6265 | 146.7 | | |
| 34 | −170.0000 | −28.2387 | 160.5 | 1.559307 | (L32) |
| 35 | −2153.8066 | −1.1124 | 159.1 | | |
| 36 | −160.8559 | −28.5266 | 155.6 | 1.559307 | (L33) |
| 37* | −834.7245 | −45.2078 | 148.5 | | |
| 38 | 1304.0831 | −14.2927 | 128.0 | 1.559307 | (L34) |
| 39 | −93.4135 | −146.1958 | 117.0 | | |
| 40* | 175.1344 | −22.0000 | 165.4 | 1.559307 | (L35) |
| 41 | 145.1494 | −1.0000 | 174.1 | | |
| 42 | −232.7162 | −21.0326 | 186.2 | 1.559307 | (L36) |
| 43* | −962.4639 | −32.8327 | 184.5 | | |
| 44 | ∞ | −4.0000 | 192.0 | | (AS) |
| 45 | −293.0118 | −42.6744 | 202.2 | 1.559307 | (L37) |
| 46 | 344.3350 | −21.8736 | 202.3 | | |
| 47 | 162.4390 | −17.9036 | 201.6 | 1.559307 | (L38) |
| 48 | 206.7120 | −1.0000 | 210.1 | | |
| 49 | ∞ | −23.2771 | 207.3 | | (L39) |
| 50 | 394.6389 | −1.0000 | 206.7 | | |
| 51 | −364.5931 | −25.4575 | 195.0 | 1.559307 | (L310) |
| 52 | 1695.8753 | −1.0000 | 190.6 | | |
| 53 | −151.9499 | −29.0060 | 166.5 | 1.559307 | (L311) |
| 54* | −800.0000 | −1.0000 | 157.0 | | |
| 55 | −101.8836 | −29.0009 | 129.3 | 1.559307 | (L312) |
| 56 | −220.0926 | −6.7987 | 109.7 | | |
| 57 | −637.4367 | −33.9854 | 104.6 | 1.559307 | (L313) |
| 58 | ∞ | −11.0000 | 63.6 | | |

(Wafer surface)
(Aspheric surface data)

TABLE 2-continued

4th surface
$\kappa = 0$
$C_4 = -5.82127 \times 10^{-8}$   $C_6 = 7.43324 \times 10^{-12}$
$C_8 = 1.66683 \times 10^{-16}$   $C_{10} = -6.92313 \times 10^{-20}$
$C_{12} = 7.59553 \times 10^{-24}$   $C_{14} = -2.90130 \times 10^{-28}$
13th surface
$\kappa = 0$
$C_4 = 4.61119 \times 10^{-8}$   $C_6 = -2.94123 \times 10^{-12}$
$C_8 = -3.08971 \times 10^{-16}$   $C_{10} = 3.40062 \times 10^{-20}$
$C_{12} = -7.92879 \times 10^{-25}$   $C_{14} = -3.73655 \times 10^{-29}$
20th surface
$\kappa = 0$
$C_4 = 7.74732 \times 10^{-8}$   $C_6 = -1.87264 \times 10^{-12}$
$C_8 = 5.25870 \times 10^{-18}$   $C_{10} = 7.64495 \times 10^{-21}$
$C_{12} = -1.54608 \times 10^{-24}$   $C_{14} = 1.16429 \times 10^{-28}$
23rd surface and 29th surface (identical surfaces)
$\kappa = 0$
$C_4 = 1.71787 \times 10^{-8}$   $C_6 = -1.00831 \times 10^{-12}$
$C_8 = 6.81668 \times 10^{-17}$   $C_{10} = -4.54274 \times 10^{-21}$
$C_{12} = 2.14951 \times 10^{-25}$   $C_{14} = -5.27655 \times 10^{-30}$
37th surface
$\kappa = 0$
$C_4 = -8.55990 \times 10^{-8}$   $C_6 = 2.03164 \times 10^{-12}$
$C_8 = -1.01068 \times 10^{-16}$   $C_{10} = 4.37342 \times 10^{-21}$
$C_{12} = -5.20851 \times 10^{-25}$   $C_{14} = 3.52294 \times 10^{-29}$
40th surface
$\kappa = 0$
$C_4 = -2.65087 \times 10^{-8}$   $C_6 = 3.08588 \times 10^{-12}$
$C_8 = -1.60002 \times 10^{-16}$   $C_{10} = 4.28442 \times 10^{-21}$
$C_{12} = -1.49471 \times 10^{-25}$   $C_{14} = 1.52838 \times 10^{-29}$
43rd surface
$\kappa = 0$
$C_4 = -8.13827 \times 10^{-8}$   $C_6 = 2.93566 \times 10^{-12}$
$C_8 = -1.87648 \times 10^{-16}$   $C_{10} = 1.16989 \times 10^{-20}$
$C_{12} = -3.92008 \times 10^{-25}$   $C_{14} = 1.10470 \times 10^{-29}$
54th surface
$\kappa = 0$
$C_4 = -3.31812 \times 10^{-8}$   $C_6 = -1.41360 \times 10^{-12}$
$C_8 = 1.50076 \times 10^{-16}$   $C_{10} = -1.60509 \times 10^{-20}$
$C_{12} = 8.20119 \times 10^{-25}$   $C_{14} = -2.18053 \times 10^{-29}$ (Values corresponding to conditional expression)
Na = 0.85
Ic = 28.8 nm
Ec = 221.6 mm
L = 1250 mm
H = 330.3 mm
(1) Ec/(NaxIc) = 9.05
(2) L/(NaxIc) = 51.1
(3) H/(NaxIc) = 13.5

Figure 7:
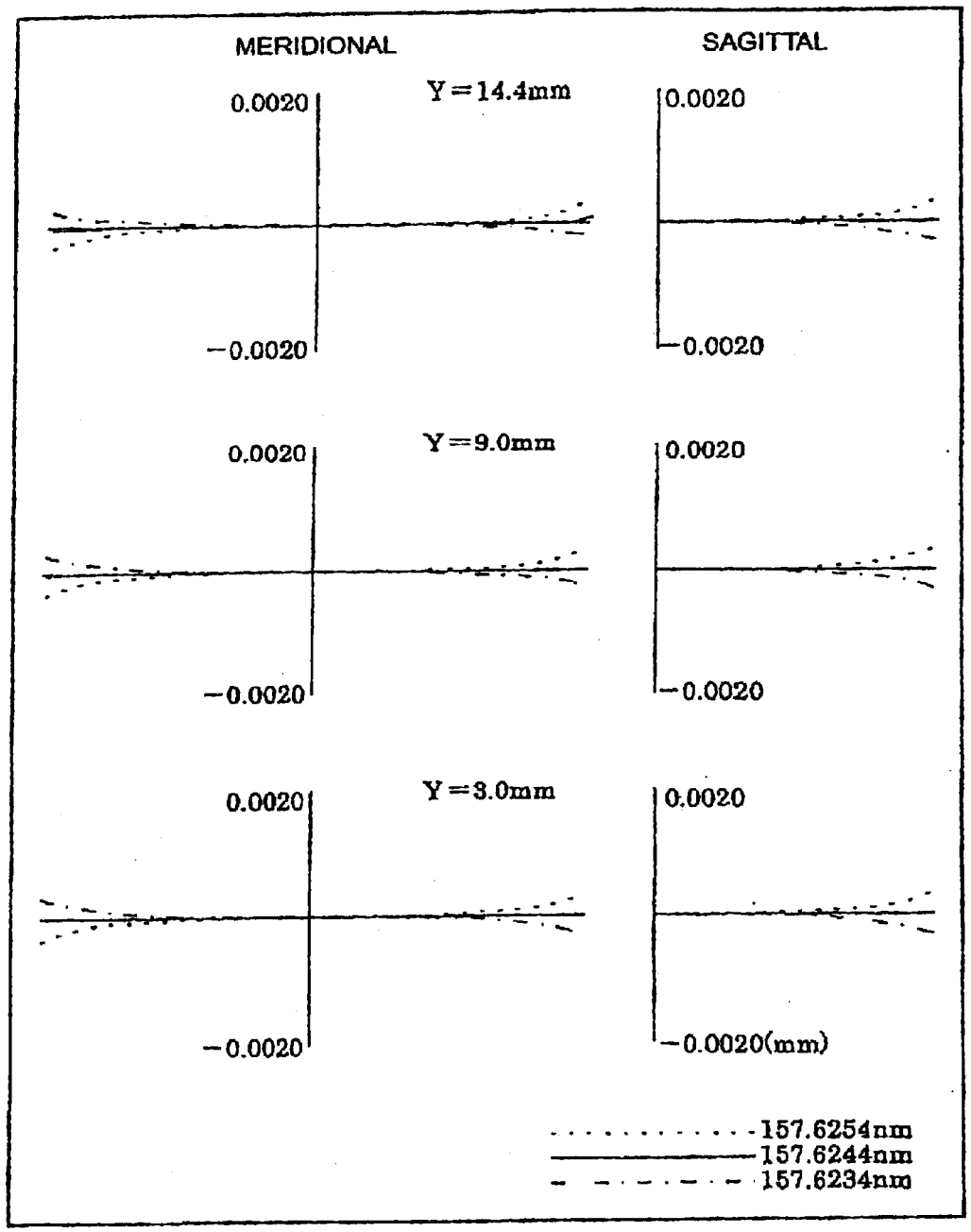
FIG. 7 is diagrams showing transverse aberrations in the second embodiment.

FIG. 7 shows diagrams illustrating transverse aberrations in the second embodiment. It can be observed that, in the second embodiment similarly to the first embodiment, chromatic aberrations are also corrected well for the exposure light with the wavelength interval of 157.6244 nm±1 pm even though relatively large image-side numerical aperture (NA=0.85) and projection field (clear aperture diameter= 28.8 mm) are secured.

As described above, in each of the embodiments, the image-side NA of 0.85 can be secured for the $F_2$ laser light with the center wavelength of 157.6244 nm, and the image circle, in which various aberrations including the chromatic aberration are corrected sufficiently, and of which effective diameter is 28.8 mm, can be secured on the wafer W. Accordingly, a high resolution of 0.1 μm or less can be attained while securing a rectangular effective exposure area of 25 mm×4 mm which is sufficiently large.

Moreover, in each of the embodiments, the clear aperture diameter Ec of the concave reflective mirror CM in the second image-forming optical system G2 that configures the protruding portion of the projection optical system PL is controlled to be small. Therefore, the mechanical stability in respect of vibrations is good, and it is easy to fabricate the fluorite lens that is to be arranged adjacently to the concave reflective mirror CM. Moreover, because the distance L between the object surface and the image surface is controlled to be relatively small, the mechanical stability in respect of vibrations is good, the operativity is good, and an advantage is brought in terms of inert gas purging. Furthermore, the distance H from the concave reflective mirror CM to the reference optical axis AX (coinciding with the optical axis. AX1 of the first image-forming optical system and the optical axis AX3 of the third image-forming optical system) is controlled to be relatively small. Therefore, the mechanical stability in respect of vibrations is good, the assembly errors are difficult to occur, and an advantage is brought in terms of inert gas purging.

In the exposure apparatus of the above-described embodiments, the reticle (mask) is illuminated by the illumination apparatus (illumination step), and the pattern to be transferred, which is formed on the mask, is exposed on the photosensitive substrate by use of the projection optical system (exposure step), thus making it possible to fabricate the microdevices (semiconductor devices, imaging devices, liquid crystal display devices, thin-film magnetic heads and the like). With reference to the flowchart of FIG. 8, a description will be made below of one example regarding a method with which the semiconductor devices are obtained as the microdevices in such a manner that a predetermined circuit pattern is formed on a wafer or the like that serves as a photosensitive substrate by using the exposure apparatus of the embodiments.

Figure 8:
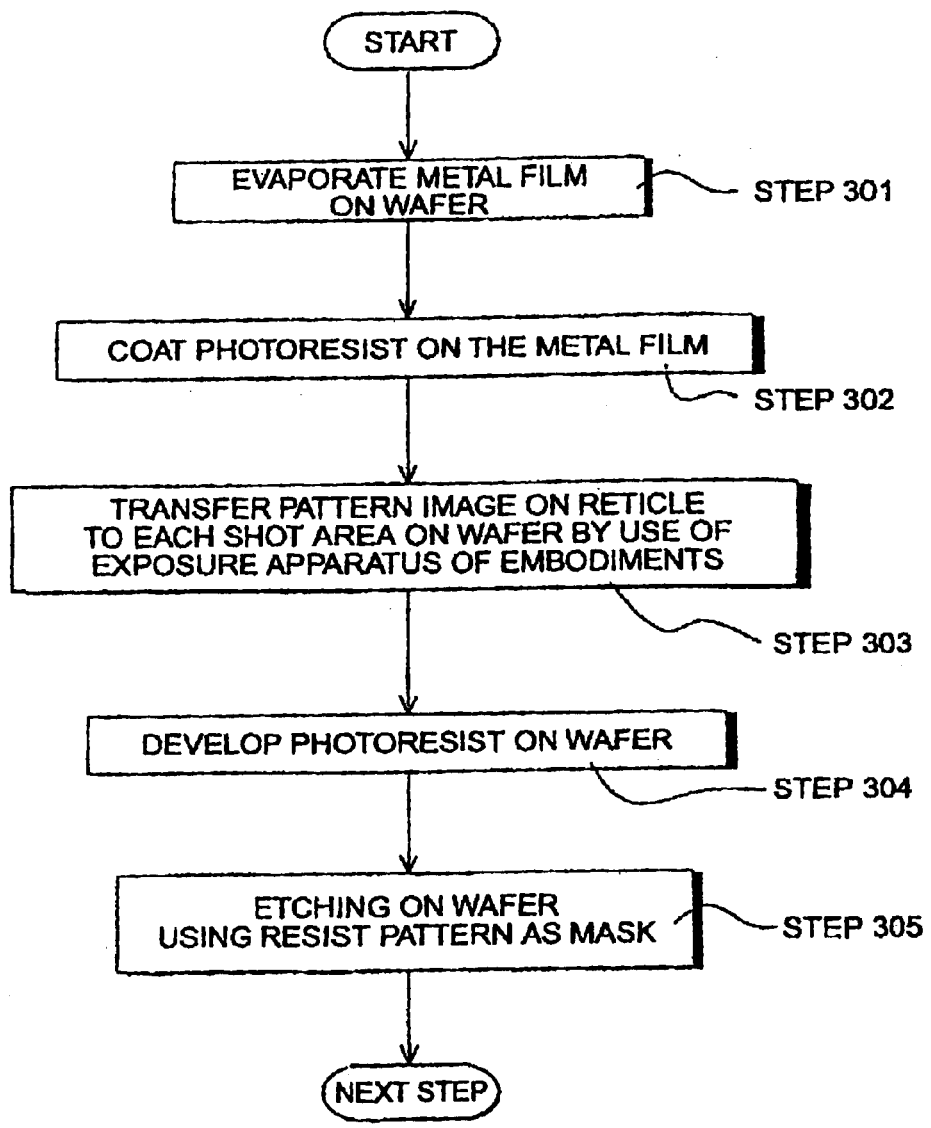
FIG. 8 is a flowchart of a method for obtaining semiconductor devices as microdevices.

First, in the step 301 of FIG. 8, a metal film is evaporated onto one lot of wafers. In the next step 302, photoresist is coated on the metal film on the one lot of wafers. Thereafter, in the step 303, a pattern image on the mask is sequentially exposed and transferred to each shot area on the one lot of wafers through the projection optical system by use of the exposure apparatus of the embodiments. Thereafter, the photoresist on the one lot of wafers is developed in the step 304. Then, in the step 305, etching is performed on the one lot of wafers using the resist pattern as a mask. Thus, the circuit pattern corresponding to the pattern on the mask is formed on each shot area on each wafer.

Thereafter, by further forming a circuit pattern on an upper layer, and so forth, devices such as the semiconductor devices are fabricated. According to the above-described semiconductor device fabrication method, semiconductor devices which include extremely micro circuit patterns can be obtained with good throughput. Note that, in the steps 301 to 305, the respective steps of the evaporation of metal on a wafer, resist coating on the metal film, followed by exposure, development and etching are performed. It is needles to say that, prior to these steps, a silicon oxidation film may be formed on the wafer, followed by the respective steps of resist coating on the silicon oxidation film exposure, development, etching and the like.

Figure 9:
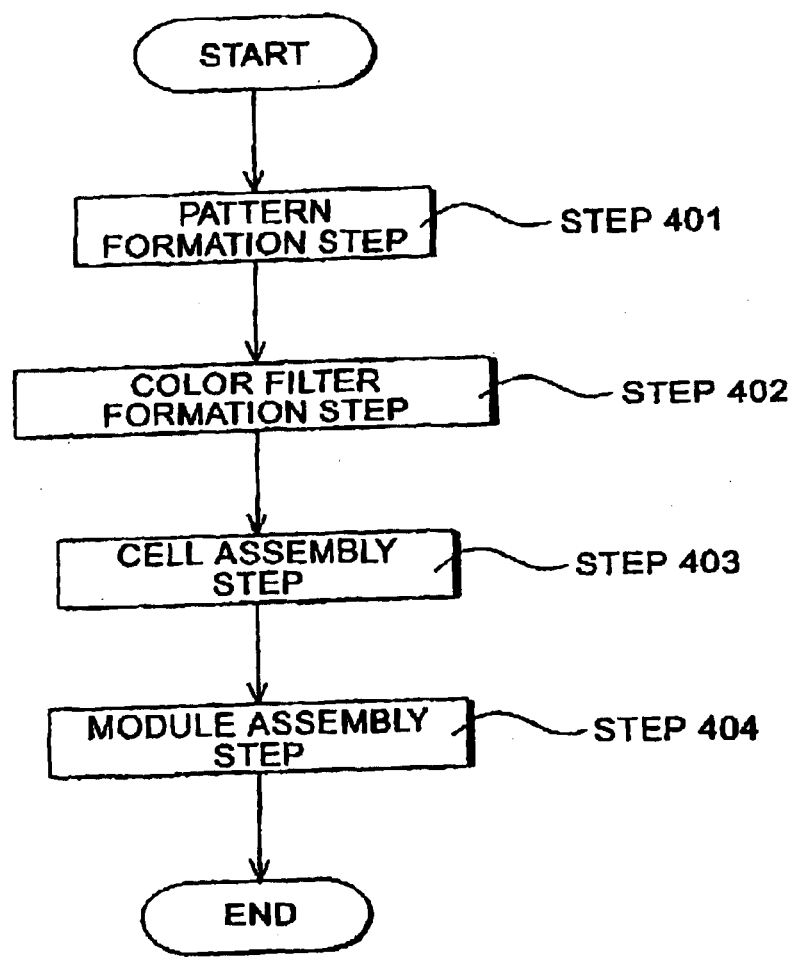
FIG. 9 is a flowchart of a method for obtaining liquid crystal display devices as microdevices.

Moreover, in the exposure apparatus of the embodiments, a predetermined pattern (circuit pattern, electrode pattern, etc.) is formed on a plate (glass substrate), thus making it possible to obtain liquid crystal display devices as microdevices. An example of a method of this case will be described below with reference to the flowchart of FIG. 9. In FIG. 9, in the pattern formation step 401, a so-called photolithography step in which a mask pattern is exposed to be transferred to a photosensitive substrate (glass substrate or the like coated with resist) is implemented by use of the exposure apparatus of the embodiments. By this photolithography step, the predetermined pattern including a large number of electrodes is formed on the photosensitive substrate. Thereafter, the exposed substrates pass through the respective steps of development, etching, resist delaminating and the like, and thus the predetermined pattern is formed on the substrate. Then, the step proceeds to the color filter formation step 402.

Next, in the color filter formation step 402, a color filter is formed. In this color filter, a large number of sets that respectively includes three dots corresponding to R (Red), G (Green) and B (Blue) are arrayed in a form of matrix, or a plurality of filter sets that respectively includes three stripes of R, G and B are arrayed in a horizontal scanning direction After the color filter formation step 402, the cell assembly step 403 is carried out. In the cell assembly step 403, a liquid crystal panel (liquid crystal cell) is assembled by use of the substrate having the predetermined pattern obtained in the pattern formation step 401, the color filter obtained in the color filter formation step 402, and the like. In the cell assembly step 403, for example, liquid crystal is injected between the substrate having the predetermined pattern that has been obtained in the pattern formation step 401, and the color filter obtained in the color filter formation step 402, thus fabricating the liquid crystal panel (liquid crystal cell).

Thereafter, in the module assembly step 404, the respective components which allow the assembled liquid crystal panel (liquid crystal cell) to perform a display operation, such as an electric circuit and a backlight, are installed to complete the liquid crystal display device. With the above-described fabrication method of the liquid crystal display device, the liquid crystal display device having an extremely micro circuit pattern can be obtained with good throughput.

Note that, although being applied to the projection optical system mounted on the exposure apparatus in the above-described embodiments, the present invention can also be applied to other general projection optical systems without being limited to the above. Moreover, the $F_2$ laser light source is used in the above-described embodiments, but yet other suitable light sources, which respectively supply light of wavelength of 180 nm or less, for example, can also be used without being limited to the above.

Moreover, in the above-described embodiments, the present invention is applied to the exposure apparatus of a step-and-scan system, in which a mask pattern is scanned and exposed for each exposure area of the substrate while moving the mask and the substrate relative to the projection optical system. However, the present invention can also be applied, without being limited to the above, to an exposure apparatus of a step-and-repeat system, in which the mask pattern is transferred in a lump (hatchwise) to the substrate in a state where the mask and the substrate are made immovable, and then the mask pattern is sequentially exposed to each exposure area by sequentially moving the substrate step by step.

Furthermore, although the aperture stop is arranged in the third image-forming optical system in the above-described embodiments, the aperture stop may also be arranged in the first image-forming optical system. Moreover, the aperture stop may also be arranged on at least one of the intermediate image position between the first image-forming optical system and the second image-forming optical system, and the intermediate image position between the second image-forming optical system and the third image-forming optical system.

Moreover, although the projection magnification of the projection optical system is set at a reduction magnification in the above-described embodiments, the projection magnification is not limited to the reduction magnification and may be set at an unit magnification or an enlargement magnification. For example, when the projection magnification is set at an enlargement magnification, a configuration may be adopted, in which light is made incident from the third image-forming optical system side, a primary image of the mask or reticle is formed by the third image-forming optical system, a secondary image is formed by the secondary image-forming optical system, and a tertiary image (final image) is formed by the first image-forming optical system on the substrate such as a wafer.

As described above, in the projection optical system of the present invention, the clear aperture diameter of the concave reflective mirror in the second image-forming optical system that configures the protruding portion thereof is controlled to be relatively small. Therefore, the mechanical stability in respect of vibrations is good, and it is easy to fabricate the fluorite lens that is arranged adjacently to the concave reflective mirror. Moreover, because the distance between the object surface and the image surface is controlled to be relatively small, the mechanical stability in respect of vibrations is good, the operativity is good, and an advantage is brought in terms of inert gas purging. Furthermore, because the distance from the concave reflective mirror to the reference optical axis is controlled to be relatively small, the mechanical stability in respect of vibrations is good, the assembly errors are difficult to occur, and an advantage is brought in terms of inert gas purging.

Accordingly, high-resolution and high-precision projection exposure can be performed in the exposure apparatus and the exposure method, in which the projection optical system of the present invention that have the relatively large image-side numerical aperture and projection field and is also excellent in mechanical stability in respect of vibrations and the like is used. Moreover, good microdevices can be fabricated by high-precision projection exposure through the high-resolution projection optical system by use of the exposure apparatus on which the projection optical system of the present invention is mounted.

The basic Japanese Application No.114208/2002 filed on Apr. 17, 2002 is hereby incorporated by reference.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system for forming an image of a first surface onto a second surface, comprising:

a first image-forming optical system for forming a first intermediate image of the first surface, the first image-forming optical system being arranged in an optical path between the first surface and the second surface;

a second image-forming optical system including at least one concave reflective mirror and for forming a second intermediate image based on a radiation beam from the first intermediate image, the second image-forming optical system being arranged in an optical path between the first image-forming optical system and the second surface; and a third image-forming optical system for forming a final image onto the second surface based on a radiation beam from the second intermediate image, the third image-forming optical system being arranged in an optical path between the second image-forming optical system and the second surface, wherein a condition of: Ec/(Na×Ic)<10 is satisfied where a clear aperture diameter of the concave reflective mirror is Ec, an effective diameter of a projection field on the second surface is Ic, and an image-side numerical aperture of the projection optical system is Na.

2. The projection optical system according to claim 1, wherein a condition of: L/(Na×Ic)<63 is satisfied where a distance between the first surface and the second surface is L, the effective diameter of the projection field on the second surface is Ic, and the image-side numerical aperture of the projection optical system is Na.

3. The projection optical system according to claim 2, wherein an optical axis of the first image-forming optical system and an optical axis of the third-image-forming optical system are set to virtually coincide with each other, and the projection optical system further comprises: a first deflection mirror arranged in an optical path between the first image-forming optical system and the second image-forming optical system; and a second deflection mirror arranged in an optical path between the second image-forming optical system and the third image-forming optical system.

4. The projection optical system according to claim 2, wherein a condition of: H/(Na×Ic)<15.5 is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

5. The projection optical system according to claim 1, wherein a condition of: H/(Na×Ic)<15.5 is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

6. The projection optical system according to claim 1, wherein an optical axis of the first image-forming optical system and an optical axis of the third-image-forming optical system are set to virtually coincide with each other, and the projection optical system further comprises: a first deflection mirror arranged in an optical path between the first image-forming optical system and the second image-forming optical system; and a second deflection mirror arranged in an optical path between the second image-forming optical system and the third image-forming optical system.

7. The projection optical system according to claim 1, wherein the projection optical system includes at least six aspheric optical surfaces.

8. The projection optical system according to claim 1, wherein each of the first image-forming optical system, the second image-forming optical system and the third image-forming optical system includes at least one aspheric optical surface.

9. A projection optical system for forming an image of a first surface onto a second surface, comprising:

a first image-forming optical system for forming a first intermediate image of the first surface, the first image-forming optical system being arranged on an optical path between the first surface and the second surface;

a second image-forming optical system including at least one concave reflective mirror and for forming a second intermediate image based on a radiation beam from the first intermediate image, the second image-forming optical system being arranged in an optical path between the first image-forming optical system and the second surface; and a third image-forming optical system for forming a final image onto the second surface based on a radiation beam from the second intermediate image, the third image-forming optical system being arranged in an optical path between the second image-forming optical system and the second surface, wherein a condition of: $L/(Na \times Ic) < 63$ is satisfied where a distance between the first surface and the second surface is L, an effective diameter of a projection field on the second surface is Ic, and an image-side numerical aperture of the projection optical system is Na.

10. The projection optical system according to claim 9, wherein an optical axis of the first image-forming optical system and an optical axis of the third-image forming optical system are set to virtually coincide with each other, and the projection optical system further comprises: a first deflection mirror arranged in an optical path between the first image-forming optical system and the second image-forming optical system; and a second deflection mirror arranged in an optical path between the second image-forming optical system and the third image-forming optical system.

11. The projection optical system according to claim 10, wherein a condition of: $H/(Na \times Ic) < 15.5$ is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

12. The projection optical system according to claim 9, wherein a condition of: $H/(Na \times Ic) < 15.5$ is satisfied where a distance between a center of a reflective surface of the concave reflective mirror and the optical axis of the first image-forming optical system is H, the effective diameter of the projection field on the second surface is Ic, and the image-side numerical aperture of the projection optical system is Na.

13. The projection optical system according to claim 9, wherein the projection optical system includes at least six aspheric optical surfaces.

14. The projection optical system according to claim 9, wherein each of the first image-forming optical system, the second image-forming optical system and the third image-forming optical system includes at least one aspheric optical surface.

15. A projection optical system for forming an image of a first surface onto a second surface, comprising:

a first image-forming optical system for forming a first intermediate image of the first surface, the first image-forming optical system being arranged in an optical path between the first surface and the second surface;

a second image-forming optical system including at least one concave reflective mirror and for forming a second intermediate image based on a radiation beam from the first intermediate image, the second image-forming optical system being arranged in an optical path between the first image-forming optical system and the second surface;

a third image-forming optical system for forming a final image onto the second surface based on a radiation beam from the second intermediate image, the third image-forming optical system being arranged in an optical path between the second image-forming optical system and the second surface;

a first deflection mirror arranged in an optical path between the first image-forming optical system and the second image-forming optical system; and a second deflection mirror arranged in an optical path between the second image-forming optical system and the third image-forming optical system, wherein an optical axis of the first image-forming optical system and an optical axis of the third-image-forming optical system are set to virtually coincide with each other, and a condition of: $H/(Na \times Ic) < 15.5$ is satisfied where a distance between a center of a reflective surface of the concave reflective mirror and the optical axis of the first image-forming optical system is H, an effective diameter of a projection field on the second surface is Ic, and an image-side numerical aperture of the projection optical system is Na.

16. The projection optical system according to claim 15, wherein the projection optical system includes at least six aspheric optical surfaces.

17. The projection optical system according to claim 15, wherein each of the first image-forming optical system, the second image-forming optical system and the third image-forming optical system includes at least one aspheric optical surface.

18. An exposure apparatus, comprising:

an illumination system for illuminating a mask that is set on the first surface; and the projection optical system according to claim 1 for forming a pattern image, which is formed on the mask, onto a photosensitive substrate that is set on the second surface.

19. The exposure apparatus according to claim 18, wherein an effective exposure area on the photosensitive substrate is a rectangular area having a center separate from the optical axis of the third image-forming optical system by a predetermined distance.

20. An exposure method, comprising the steps of:

illuminating a mask that is set on the first surface; and projecting and exposing a pattern image, which is formed on the mask, through the projection optical system according to claim 1 onto a photosensitive substrate which is set on the second surface.

21. An exposure apparatus, comprising:

an illumination system for illuminating a mask that is set on the first surface; and the projection optical system according to claim 9 for forming a pattern image, which is formed on the mask, onto a photosensitive substrate that is set on the second surface.

22. The exposure apparatus according to claim 21, wherein an effective exposure area on the photosensitive substrate is a rectangular area having a center separate from the optical axis of the third image-forming optical system by a predetermined distance.

23. An exposure method, comprising the steps of:

illuminating a mask that is set on the first surface; and projecting and exposing a pattern image, which is formed on the mask, through the projection optical system according to claim 9 onto a photosensitive substrate that is set on the second surface.

24. An exposure apparatus, comprising:

an illumination system for illuminating a mask that is set on the first surface; and the projection optical system according to claim 15 for forming a pattern image, which is formed on the mask, onto a photosensitive substrate that is set on the second surface.

25. The exposure apparatus according to claim 24, wherein an effective exposure area on the photosensitive substrate is a rectangular area having a center separate from an optical axis of the third image-forming optical system by a predetermined distance.

26. An exposure method, comprising the steps of:

illuminating a mask that is set on the first surface; and projecting and exposing a pattern image, which is formed on the mask, through the projection optical system according to claim 15 onto a photosensitive substrate that is set on the second surface.

* * * * *